United States Patent
Dadvand et al.

(10) Patent No.: US 11,594,504 B2
(45) Date of Patent: Feb. 28, 2023

(54) NICKEL ALLOY FOR SEMICONDUCTOR PACKAGING

(71) Applicant: TEXAS INSTRUMENTS INCORPORATED, Dallas, TX (US)

(72) Inventors: Nazila Dadvand, Richardson, TX (US); Christopher Daniel Manack, Flower Mound, TX (US); Salvatore Frank Pavone, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 50 days.

(21) Appl. No.: 17/234,429

(22) Filed: Apr. 19, 2021

(65) Prior Publication Data

US 2021/0242151 A1     Aug. 5, 2021

Related U.S. Application Data

(62) Division of application No. 15/901,631, filed on Feb. 21, 2018, now Pat. No. 11,011,483.

(51) Int. Cl.
*H01L 23/00*     (2006.01)
*H01L 21/78*     (2006.01)

(52) U.S. Cl.
CPC .............. *H01L 24/05* (2013.01); *H01L 21/78* (2013.01); *H01L 24/03* (2013.01); *H01L 24/45* (2013.01); *H01L 24/32* (2013.01); *H01L 24/48* (2013.01); *H01L 24/73* (2013.01); *H01L 2224/0345* (2013.01); *H01L 2224/03462* (2013.01); *H01L 2224/04042* (2013.01); *H01L 2224/05017* (2013.01); *H01L 2224/05082* (2013.01); *H01L 2224/05147* (2013.01);
(Continued)

(58) Field of Classification Search
CPC ......... H01L 24/05; H01L 21/78; H01L 24/03; H01L 24/45; H01L 24/32; H01L 24/48; H01L 24/73; H01L 2224/05558; H01L 2224/05655; H01L 2924/01058; H01L 2224/45147; H01L 2224/85455
See application file for complete search history.

(56) References Cited

U.S. PATENT DOCUMENTS 6,501,185 B1    12/2002   Chow et al.
6,812,580 B1    11/2004   Wenzel et al.
(Continued)

*Primary Examiner* — Douglas W Owens
(74) *Attorney, Agent, or Firm* — Dawn Jos; Frank D. Cimino

(57) ABSTRACT

A packaged semiconductor die includes a semiconductor die coupled to a die pad. The semiconductor die has a front side containing copper leads, a copper seed layer coupled to the copper leads, and a nickel alloy coating coupled to the copper seed layer. The nickel alloy includes tungsten and cerium (NiWCe). The packaged semiconductor die may also include wire bonds coupled between leads of a lead frame and the copper leads of the semiconductor die. In addition, the packaged semiconductor die may be encapsulated in molding compound. A method for fabricating a packaged semiconductor die. The method includes forming a copper seed layer over the copper leads of the semiconductor die. In addition, the method includes coating the copper seed layer with a nickel alloy. The method also includes singulating the semiconductor wafer to create individual semiconductor die and placing the semiconductor die onto a die pad of a lead frame.

15 Claims, 6 Drawing Sheets

(52) U.S. Cl.
CPC ............ *H01L 2224/05558* (2013.01); *H01L 2224/05566* (2013.01); *H01L 2224/05571* (2013.01); *H01L 2224/05573* (2013.01); *H01L 2224/05655* (2013.01); *H01L 2224/05684* (2013.01); *H01L 2224/05693* (2013.01); *H01L 2224/32245* (2013.01); *H01L 2224/45124* (2013.01); *H01L 2224/48245* (2013.01); *H01L 2224/48247* (2013.01); *H01L 2224/48465* (2013.01); *H01L 2224/73265* (2013.01); *H01L 2924/01058* (2013.01)

(56) References Cited

U.S. PATENT DOCUMENTS

| | | |
|---|---|---|
| 2005/0062169 A1 | 3/2005 | Dubin et al. |
| 2007/0105280 A1 | 5/2007 | Li |
| 2008/0157395 A1 | 7/2008 | Belanger et al. |
| 2015/0159241 A1 | 6/2015 | Hamaguchi et al. |
| 2019/0109109 A1* | 4/2019 | Dadvand ................ H01L 24/13 |
| 2019/0259717 A1* | 8/2019 | Dadvand ................ H01L 24/05 |

* cited by examiner

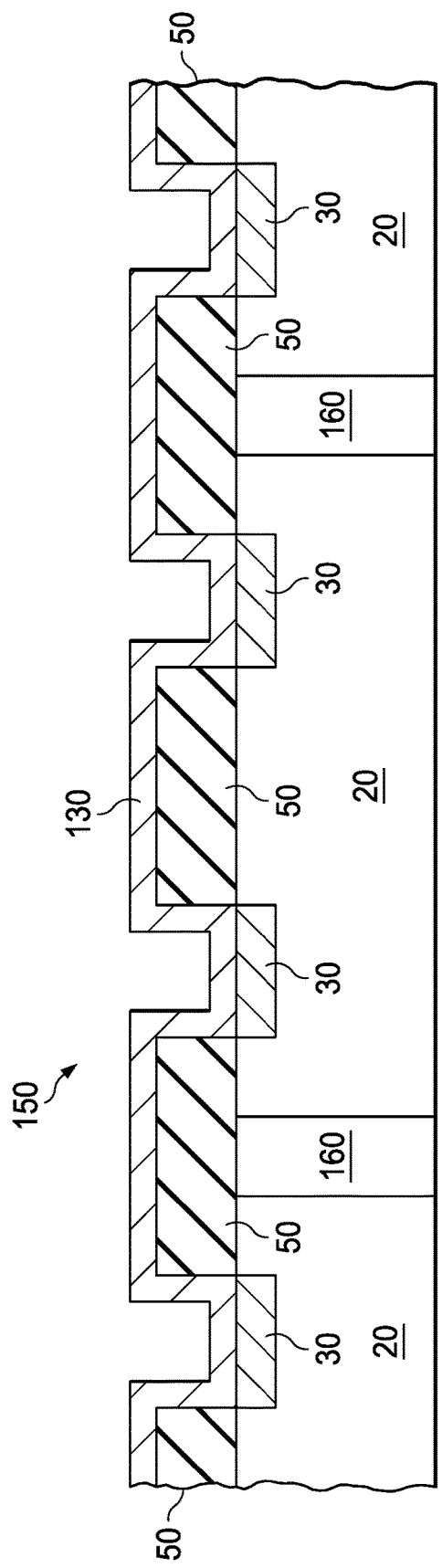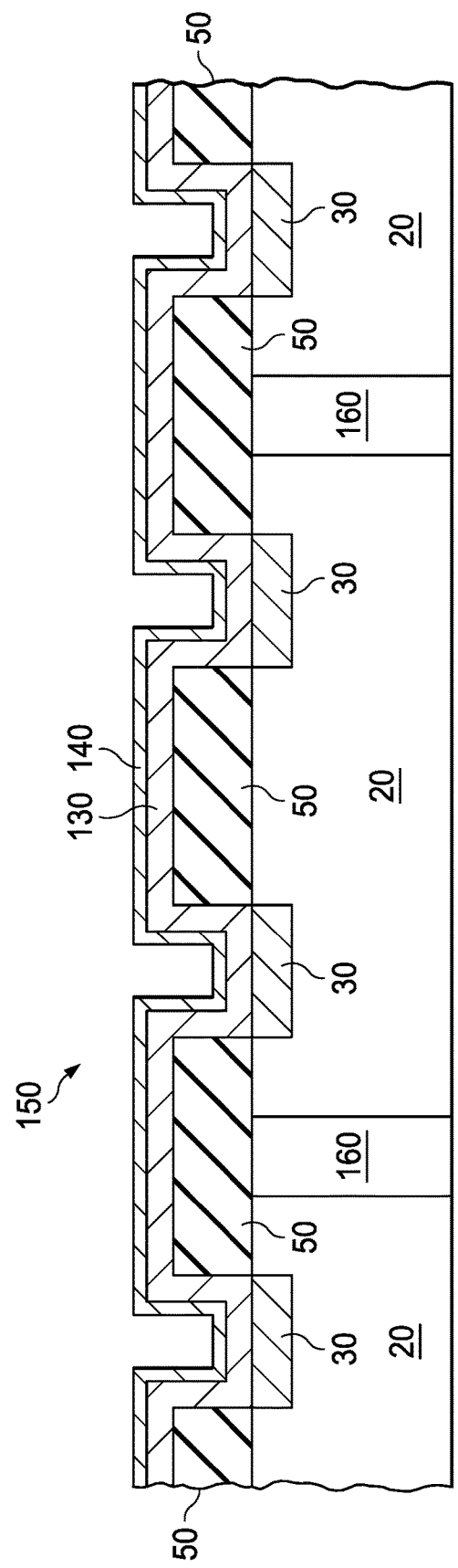

NICKEL ALLOY FOR SEMICONDUCTOR PACKAGING

CROSS-REFERENCE TO RELATED APPLICATIONS

This application is a divisional of and claims the benefit to prior application Ser. No. 15/901,631, filed Feb. 21, 2018, currently pending, the contents of which are incorporated herein by reference.

BACKGROUND OF THE INVENTION

This invention relates to the packaging of a semiconductor die.

BRIEF DESCRIPTION OF THE DRAWINGS

FIGS. 3-9 are cross-sectional diagrams of selected steps of the method of FIG. 2.

DETAILED DESCRIPTION OF THE INVENTION

Figure 1:
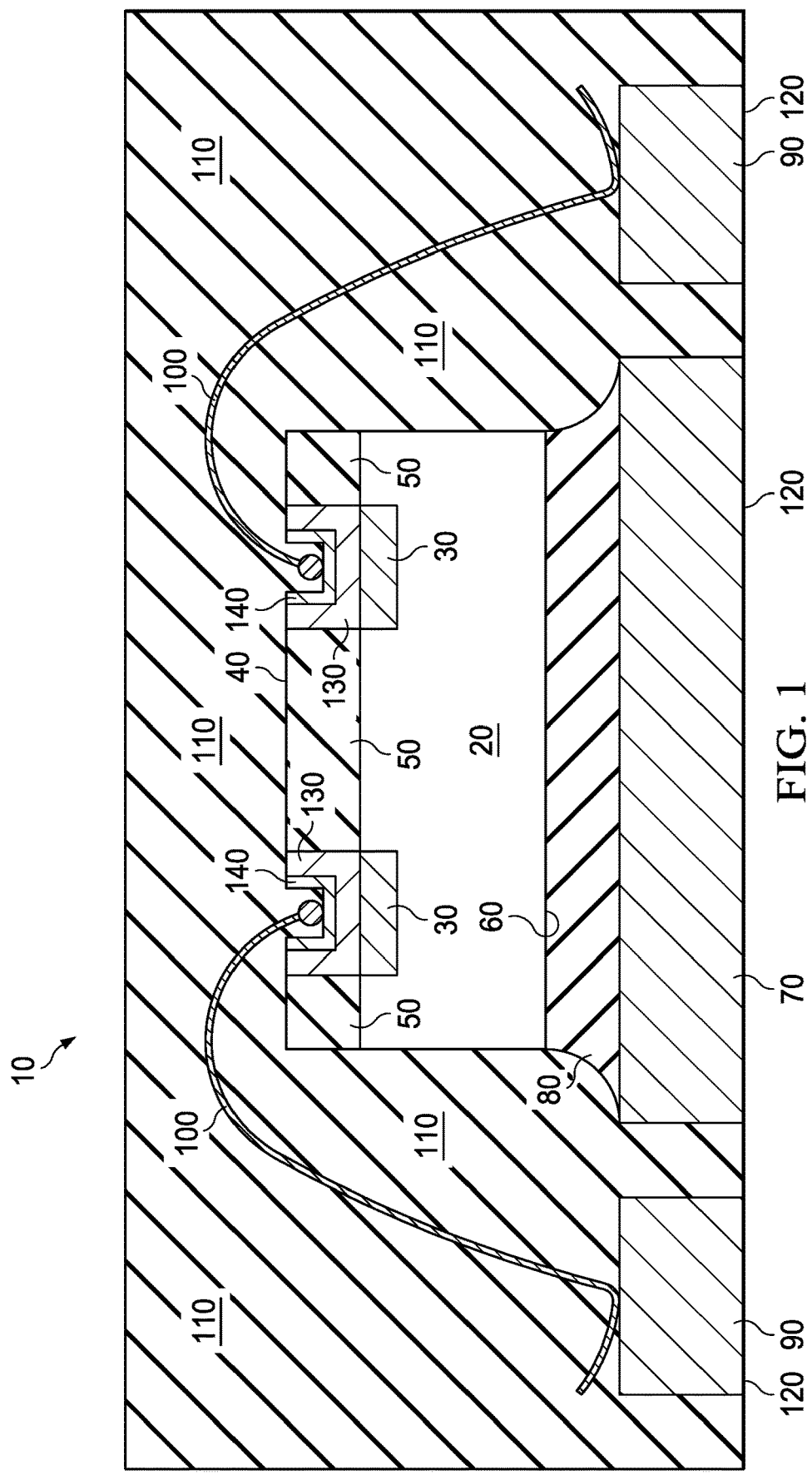
FIG. 1 is a cross-sectional view of a packaged semiconductor die having a nickel alloy connector coating in accordance with the present invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Referring to the drawings, FIG. 1 is a cross-sectional view of a packaged semiconductor die 10 in accordance with an example embodiment of the invention. In this example, a semiconductor die 20 has copper leads 30 on a front side 40 of the semiconductor die 20. The copper leads 30 are connected to circuitry within the semiconductor die 20 (not shown). A protective overcoat layer 50 protects the front side 40 of the semiconductor die 20. The back side 60 of the semiconductor die 20 is secured to a die pad 70 of a lead frame by any suitable attachment medium 80, such as solder or a layer of adhesive. The lead frame also includes leads 90 that electrically couple the circuitry within the semiconductor die 20 to other electrical devices (not shown). The lead frame (70, 90) may be comprised of copper or it may be comprised of copper that is plated with an electrically conductive metal (such as nickel or gold).

Wire bonds 100 electrically connect the semiconductor die 20 to the leads 90 of the lead frame. The wire bonds 100 may be any suitable material, such as aluminum, copper, or gold. Molding compound 110 encapsulates the semiconductor die 20, the die attachment medium 80, the wire bonds 100, and portions of the die pad 70 and leads 90 of the lead frame. A surface 120 of the die pad 70 and leads 90 may be left unencapsulated so that heat generated by the semiconductor die can be dissipated and the packaged semiconductor die 10 can be electrically connected to other electrical devices (not shown).

In accordance with the example embodiment, a copper seed layer 130 is applied over the copper leads 30 of the semiconductor die 20 and a nickel alloy 140 is coated over the copper seed layer 130. The copper seed layer 130 may facilitate the process of forming the nickel alloy coating, as explained more fully below. Moreover, the nickel alloy 140 may act as a barrier against the corrosion of the copper seed layer 130 and the copper leads 30. In addition, the nickel alloy 140 may act as a barrier to the diffusion of copper.

More specifically, the nickel alloy 140 of the example embodiment includes tungsten and cerium. Nickel acts to reduce the interfacial reactions between the aluminum wire bonds 100 and the copper leads 30 of the semiconductor die 20. However, pure nickel causes the interface between the wire bonds 100 and the copper leads 30 to become brittle due to copper corrosion (resulting in reliability issues for the packaged semiconductor die 10). Therefore, cerium is added to the nickel to increase corrosion resistance (by helping to prevent the oxidation of coper leads 30). In addition, pure nickel allows copper to diffuse from the copper leads 30 towards the wire bonds 100. Therefore, tungsten is also added to the nickel alloy coating 140 to help block the copper diffusion paths from the leads 30 of the semiconductor die 20 (due to the segregation of tungsten towards the grain boundaries of nickel). The nickel alloy 140 of the example embodiment may provide cost savings. Specifically, nickel alloy 140 is less expensive than other currently used connector materials, such as alloys containing gold or palladium.

Figure 2:
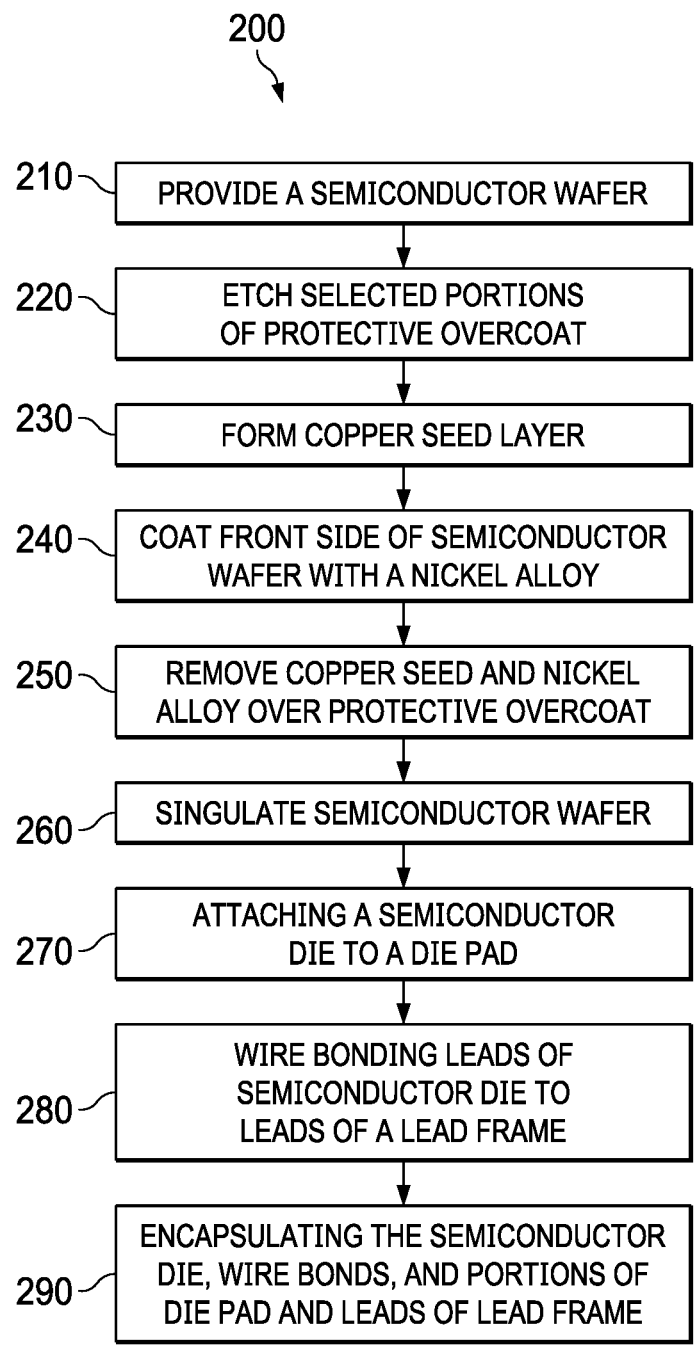
FIG. 2 is a method for fabricating the packaged semiconductor die of FIG. 1.

FIG. 2 shows an example method 200 for fabricating the packaged semiconductor die 10 of FIG. 1. FIGS. 3-9 illustrate selected steps of method 200. The example method 200 is exemplary but not restrictive of alternative ways of implementing the principles of the invention. Moreover, features and procedures whose implementations are well known to those skilled in the art are omitted for brevity. For example, the implementation of common fabrication steps lies within the ability of those skilled in the art and accordingly any detailed discussion thereof may be omitted.

Figure 3:
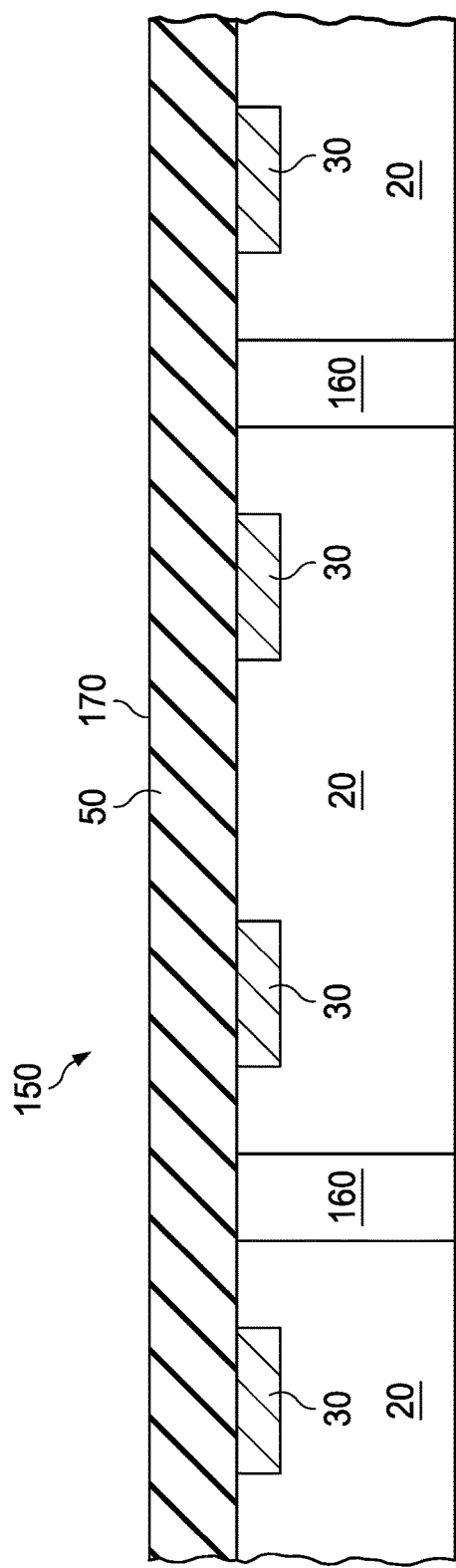

Step 210 is the provision of a fully processed semiconductor wafer 150, as shown in FIG. 3. The semiconductor wafer 150 contains numerous completed semiconductor dies 20. The semiconductor dies may contain any combination of active and passive devices, such as CMOS, BiCMOS and bipolar junction transistors—as well as capacitors, optoelectronic devices, inductors, resistors, and diodes. In addition, the semiconductor wafer 150 has a protective overcoat 50 that may prevent surface leakage of electrical current and also protect against unwanted moisture, contamination, cracking, and processing damage.

The semiconductor dies 20 are spaced apart from each other on the semiconductor wafer 150 by zones 160 of unprocessed semiconductor material. These zones 160 of unprocessed semiconductor material are mostly destroyed by a rotating saw blade during the singulation process (as explained below). Therefore, the zones 160 of unprocessed semiconductor material are often called "saw streets" because they form a grid between all of the semiconductor dies 20 on the semiconductor wafer 150 that is largely destroyed by the saw during the dicing process. The semiconductor wafer 150 has a front side 170 that includes the leads 30 of the semiconductor die 20. In addition, the semiconductor wafer 150 has a back side 180 that is opposite to the front side 40.

Figure 4:
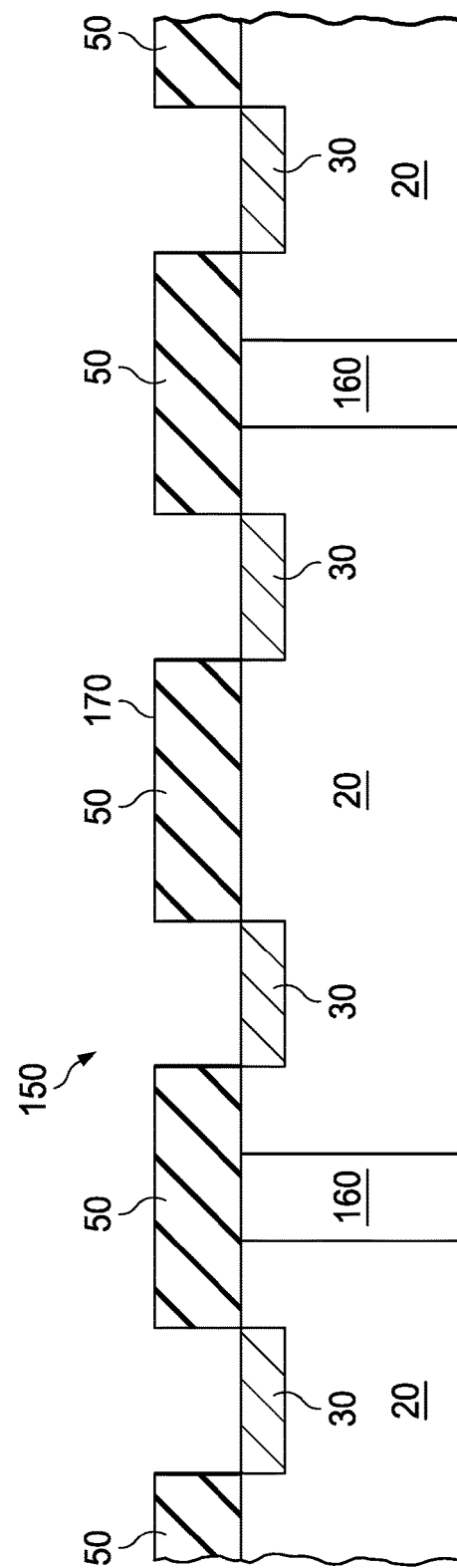

Step 220 is the removal of the protective overcoat 50 over the copper leads 30 of the semiconductor dies. More specifically, a patterned photoresist is applied over the front surface 170 of the semiconductor wafer 150 and then an etchant is used to remove the protective overcoat 50 over the copper leads 30, as shown in FIG. 4. The patterned photoresist is removed following the etching step.

As shown in FIG. 5, step 230 is the formation of a copper seed layer 130. In the example embodiment, the copper seed layer 130 is formed by a sputtering process. However, the copper seed layer may be formed by alternative processes (such as electroplating or electroless plating).

Next, in step 240, the copper seed layer 130 is coated with a nickel alloy 140. It is to be noted that the copper seed layer 130 and the coating of nickel alloy 140 may not be conformal over the etched protective overcoat 50, as shown in FIG. 6. Rather, those layers may have smoothed transitions between the protective overcoat 50 and the copper leads 30. In the example embodiment, the nickel alloy 140 is formed by an electroplating process (using the copper seed layer 130 as the negative electrode connected to the external power source). However, another process (such as sputtering or electroless plating) may be used to create the nickel alloy 140.

The nickel alloy 140 in the example application is NI-10 wt % W-.5 wt % Ce. Therefore, the nickel alloy 140 is a mixture of 89.5% nickel, 10.0% tungsten, and 0.5% cerium. However, the amount of tungsten may range from 0.5% to 35.0%. Furthermore, the amount of cerium may range from 0.05% to 0.5%.

Figure 7:
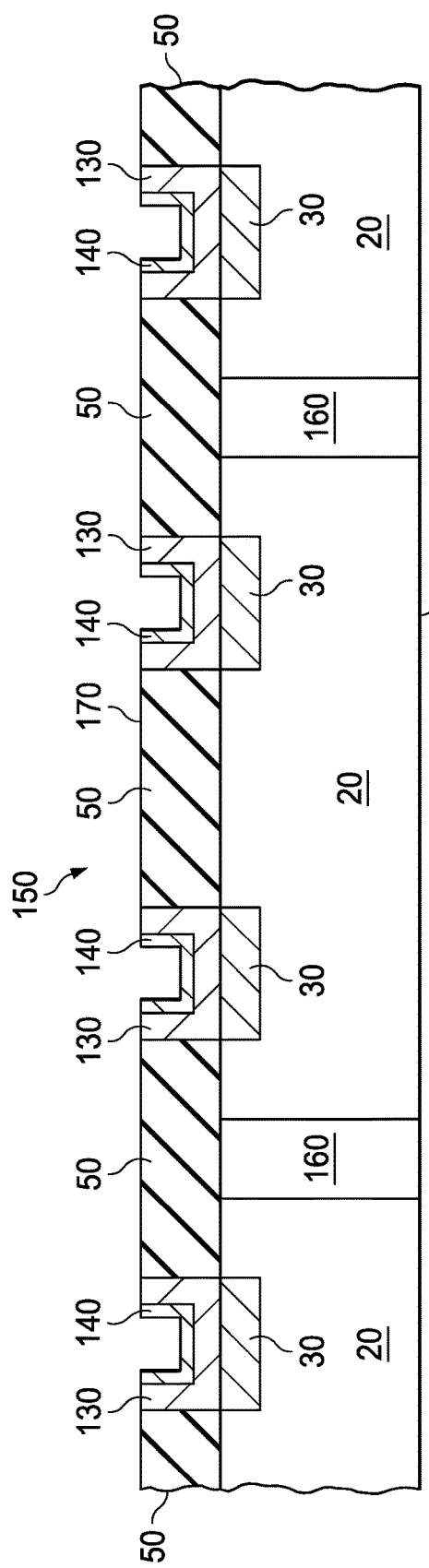

As shown in FIG. 7, step 250 is the removal of the copper seed layer 130 and the nickel alloy 140 over the protective overcoat 50. This may be done by any acceptable process, such as chemical mechanical polishing (CMP). The semiconductor wafer 150 now has the copper seed layer 130 and nickel alloy 140 present only over the copper leads 30.

Figure 8:
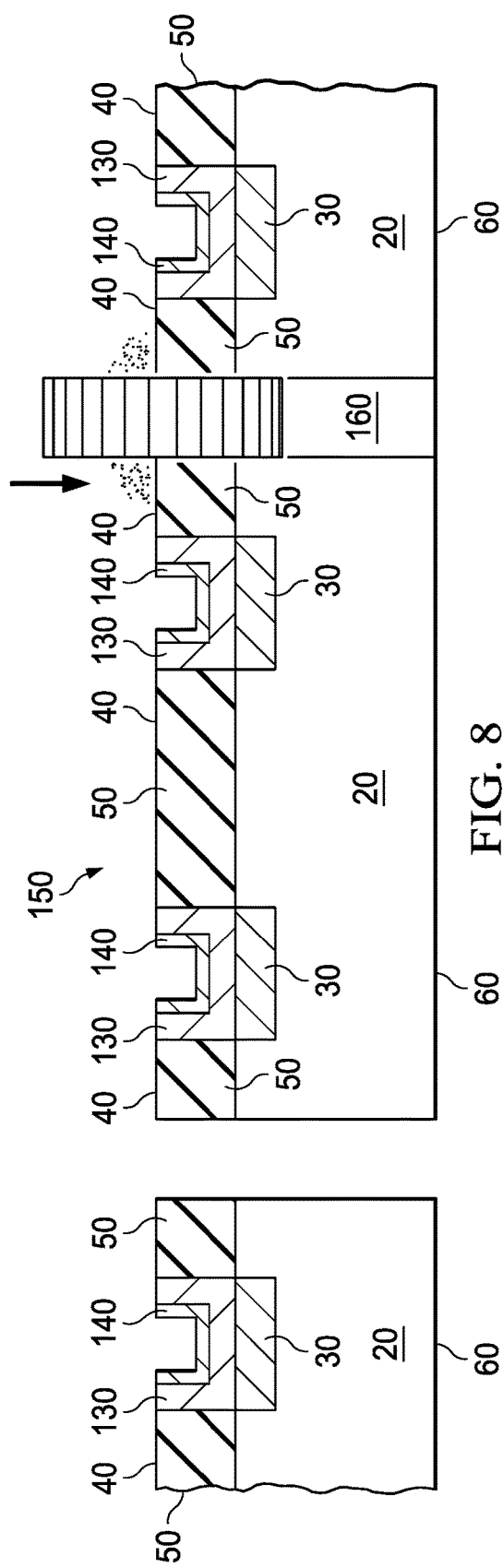

The semiconductor wafer 150 is singulated in step 260, as shown in FIG. 8. Typically a rotating saw blade cuts through the saw street zones 160. This singulation process creates individual semiconductor dies 20 that can be further processed into a packaged semiconductor die 10 (as explained more fully in the following process steps).

Figure 9:
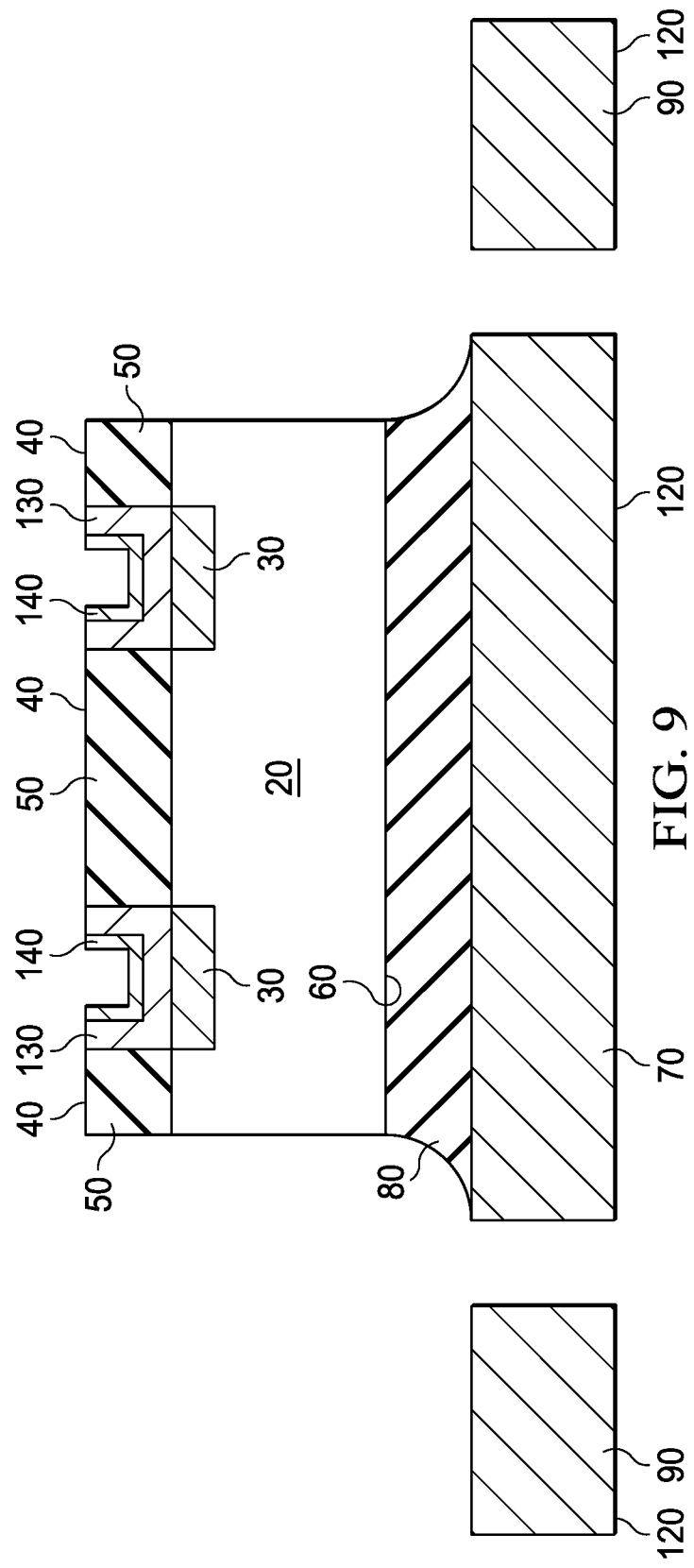

A shown in FIG. 9, step 270 is the attachment of the semiconductor die 20 to a die pad 70 of a lead frame. Typically a robotic pick-and-place machine is used to place the back side 60 of the semiconductor die 20 onto the die pad 70. Any suitable attachment medium 80 (such as solder or a layer of adhesive) may be used to secure the semiconductor die 20 to the die pad 70. In addition, pressure is often applied to the front side 40 of the semiconductor die 20 to push the attachment medium 80 firmly onto the die pad 70 (which may create filets along the edges of attachment medium 80, as shown in FIG. 9).

In step 280 a wire bonding process is used to form wire bonds 100 between the leads 30 of the semiconductor die 20 and the leads 90 of the lead frame, as shown in FIG. 1. As described above, the wire bonds 100 may be comprised of aluminum. The wire bonds 100 provide an electrical connection between the leads 30 that are located on the front surface 40 of the semiconductor die 20 and the leads 90 of the lead frame. The final step 290 of the example method 200 is the encapsulation of the semiconductor die 20, the wire bonds 100, the attachment medium 80, and a portion of the die pad 70 and the leads 30 of the lead frame with molding compound 110. The surface 120 of the die pad 70 and the leads 90 may be left unencapsulated (as shown in FIG. 1) so that the semiconductor die 20 can be electrically connected to other electrical devices (not shown).

Additional modifications to the invention as described above are within the scope of the claimed invention. As an example, it may be desirable to clean the semiconductor wafer 150 after the copper leads 30 have been exposed in the etching step 220 in order to remove any copper oxide that may have formed before the sputtering step. Similarly, it may be desirable to clean the semiconductor wafer 150 following the CMP step 250 to remove any unwanted debris created by the polishing operation.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method for fabricating a semiconductor wafer, comprising:
   providing a fully processed semiconductor wafer that includes more than one semiconductor die, the semiconductor wafer having a front side containing copper leads of said more than one semiconductor die and a back side that is opposite to said front side;
   etching selected portions of a protective overcoat layer from said fully processed semiconductor wafer to expose a top surface of said copper leads;
   forming a copper seed layer over said front side of said semiconductor wafer; and
   coating said front side of said semiconductor wafer with a nickel alloy that includes tungsten and cerium (NiWCe).

2. The method of claim 1 wherein said coating is electroplated.

3. The method of claim 1 wherein said copper seed layer is formed by sputtering.

4. The method of claim 1 wherein an amount of said tungsten in said nickel alloy is 10.0 wt %.

5. The method of claim 1 wherein an amount of said tungsten in said nickel alloy is in a range between 0.5 wt % and 35.0 wt %.

6. The method of claim 1 wherein an amount of said cerium in said nickel alloy is 0.5 wt %.

7. The method of claim 1 wherein an amount of said cerium in said nickel alloy is in a range between 0.05 wt % and 0.5 wt %.

8. A method for fabricating a packaged semiconductor die, comprising:
   providing a fully processed semiconductor wafer that includes more than one semiconductor die, the semiconductor wafer having a front side containing copper leads of said more than one semiconductor die and a back side that is opposite to said front side;
   etching selected portions of a protective overcoat layer from said fully processed semiconductor wafer to expose a top surface of said copper leads;
   forming a copper seed layer over said front side of said semiconductor wafer;

coating said front side of said semiconductor wafer with a nickel alloy that includes tungsten and cerium (NiWCe);

removing said copper seed and said nickel alloy located over said protective overcoat;

singulating said semiconductor wafer to create said semiconductor die having a front side containing said leads of said semiconductor die and a back side that is opposite to said front side;

attaching said back side of said semiconductor die onto a die pad;

wire bonding said leads of said semiconductor die to leads of a lead frame; and encapsulating said semiconductor die, said wire bonds, and portions of said die pad and said leads of said lead frame in molding compound.

9. The method of claim 8 wherein said coating is electroplated.

10. The method of claim 8 wherein said copper seed layer is formed by sputtering.

11. The method of claim 8 wherein an amount of said tungsten in said nickel alloy is 10.0 wt %.

12. The method of claim 8 wherein an amount of said tungsten in said nickel alloy is in a range between 0.5 wt % and 35.0 wt %.

13. The method of claim 8 wherein an amount of said cerium in said nickel alloy is 0.5 wt %.

14. The method of claim 8 wherein an amount of said cerium in said nickel alloy is in a range between 0.05 wt % and 0.5 wt %.

15. The method of claim 8 wherein wire bonds created by said wire boding process include aluminum.

* * * * *